(12) United States Patent
Ahn et al.

(10) Patent No.: US 8,399,103 B2
(45) Date of Patent: Mar. 19, 2013

(54) COATED CEMENTED CARBIDE CUTTING TOOLS AND METHOD FOR PRE-TREATING AN COATING TO PRODUCE CEMENTED CARBIDE CUTTING TOOLS

(75) Inventors: Dong Gil Ahn, Daegu (KR); Kern Woo Lee, Daegu (KR)

(73) Assignee: TaeguTec, Ltd., Daegu (KR)

( * ) Notice: Subject to any disclaimer, the term of this patent is extended or adjusted under 35 U.S.C. 154(b) by 391 days.

(21) Appl. No.: 12/597,704

(22) PCT Filed: Apr. 27, 2007

(86) PCT No.: PCT/KR2007/002084
§ 371 (c)(1),
(2), (4) Date: Oct. 26, 2009

(87) PCT Pub. No.: WO2008/133360
PCT Pub. Date: Nov. 6, 2008

(65) Prior Publication Data
US 2010/0119773 A1    May 13, 2010

(51) Int. Cl.
*B32B 9/00* (2006.01)
(52) U.S. Cl. ............ 428/469; 51/307; 51/309; 427/307; 427/309; 427/331; 427/368
(58) Field of Classification Search ............... 51/307, 51/309; 428/469, 472; 427/307, 309, 331, 427/368
See application file for complete search history.

(56) References Cited

U.S. PATENT DOCUMENTS

| | | | |
|---|---|---|---|
| 4,911,989 A * | 3/1990 | Minoru et al. | 419/13 |
| 5,585,176 A * | 12/1996 | Grab et al. | 428/472 |
| 5,643,658 A * | 7/1997 | Uchino et al. | 428/472 |
| 5,752,155 A * | 5/1998 | Gates et al. | 419/5 |
| 5,955,212 A * | 9/1999 | Matsumoto et al. | 427/249.18 |
| 6,589,602 B2 * | 7/2003 | Kobayashi et al. | 427/419.1 |
| 6,692,822 B2 * | 2/2004 | Andersson et al. | 428/472 |

(Continued)

FOREIGN PATENT DOCUMENTS

| | | |
|---|---|---|
| EP | 1175949 A1 | 1/2002 |
| EP | 1253124 A1 | 10/2002 |
| EP | 1696051AQ | 8/2006 |
| JP | 6-108253 A | 4/1994 |
| JP | 2002-036791 * | 2/2002 |
| KR | 10-0655116 | 12/2006 |

OTHER PUBLICATIONS

International Search Report in PCT/KR2007/002084, dated Jan. 23, 2008. Written Opinion in PCT/KR2007/002084, dated Jan. 23, 2008. European Search report dated Dec. 28, 2011 issued in counterpart EP Application No. 07746241.4.

*Primary Examiner* — Archene Turner
(74) *Attorney, Agent, or Firm* — Womble Carlyle

(57) ABSTRACT

A method of a pre-treatment process for coating notably improves both the surface roughness of a coating layer of a cemented carbide cutting tool and the bonding force of the coating layer to the substrate. According to the method, a sintered surface layer within a range of 0.5-5 μm, which corresponds to the tungsten carbide particle size of a substrate, is properly removed from the substrate surface of a cemented carbide cutting tool. Thus, a porous sintered surface layer having a non-uniform structure is removed and a substrate surface having high structure density and evenness is provided compared to blasting pre-treatment. In order to obtain a sufficient bonding force between a coating layer and the substrate, the surface ratio of open pores, which exist around tungsten carbide particles appearing by removal of the porous sintered surface, is equal to or more than 5%.

7 Claims, 4 Drawing Sheets

U.S. PATENT DOCUMENTS

| | | | |
|---|---|---|---|
| 6,723,389 B2 * | 4/2004 | Kobayashi et al. | 427/307 |
| 6,838,151 B2 * | 1/2005 | Kato | 407/119 |
| 7,232,603 B2 * | 6/2007 | Hessman | 428/472 |
| 7,476,437 B2 * | 1/2009 | Jonsson | 51/307 |
| 7,655,293 B2 * | 2/2010 | Ljungberg | 428/216 |
| 7,883,775 B2 * | 2/2011 | Kazahaya et al. | 428/408 |
| 2005/0129951 A1 | 6/2005 | Collin et al. | |
| 2006/0188748 A1 * | 8/2006 | Kjellgren et al. | 427/419.2 |

\* cited by examiner

COATED CEMENTED CARBIDE CUTTING TOOLS AND METHOD FOR PRE-TREATING AN COATING TO PRODUCE CEMENTED CARBIDE CUTTING TOOLS

TECHNICAL FIELD

The present invention relates to a coated cemented carbide cutting tool and a method of manufacturing the same.

BACKGROUND ART

The coating layer of a cutting tool is important in increasing the abrasion resistance, reducing the friction of the tool and improving the tool life. When the surface roughness of a coating layer on the surface of the cutting tool is high, cutting resistance increases. This causes the cutting tool to easily adhere to a workpiece and results in the separation of the coating layer therefrom. Thus, the performance of the cutting tool is deteriorated and the tool life is shortened. To prevent this problem, it is necessary to improve the surface roughness of a coating layer as well as the bonding force between the coating layer and the substrate of the cutting tool.

The substrate of a cemented carbide cutting tool is made by molding tungsten carbide (WC) powders and cobalt (Co) powders into a desired shape, heating and sintering the same at a high temperature. Since the surface of the substrate is directly exposed to temperature changes during the sintering step, tungsten carbide and cobalt are formed on the surface in a non-uniform structure and severe unevenness also results. In contrast, the inner side of the substrate has a uniform and fine structure. When a coating layer is formed on such a substrate surface of the cemented carbide cutting tool, the non-uniform structure of the cemented carbide and cobalt on the substrate surface interrupts the uniform formation of the coating layer. Further, the bonding force between the coating layer and the substrate becomes weak so that the coating layer is easily separated. Thus, notwithstanding the coating layer formed on the substrate of the cemented carbide cutting tool, the basic objective of the coating (i.e., improving tool performance and extending tool life) cannot be achieved. Also, when a coating layer is formed by a conventional coating technique such as arc ion plating, macro droplets are formed on the surface of the coating layer such that the surface roughness of the coating layer is more degraded during the coating process.

To improve these problems, a "post-treating process" may be applied after the coating process to improve the surface roughness of the coating layer. However, this process does not effectively improve the surface roughness of the coated cemented carbide cutting tool. Additionally, it cannot essentially improve the bonding force between the coating layer and the substrate since the bonding force of the coating layer to the substrate is not improved by post-treatment of the coating layer.

Alternatively, blasting may be applied to the substrate as a "pre-treating process," which treats the substrate surface of a cemented carbide cuffing tool before the coating process. By injecting hard particles on the surface of the cutting tool substrate at a high speed, the blasting removes a part of the surface and dusts thereon and polishes the surface. The hard particles, such as alumina, have a size of tens of microns. However, even with the blasting, the non-uniform structure and severe irregularities are not sufficiently removed. Further, it is difficult to sufficiently improve the surface roughness of the coating layer and the bonding force between the coating layer and the substrate.

SUMMARY OF THE INVENTION

The present invention is conceived to solve the aforementioned problems of the prior art. It is an object of the present invention to provide a method of a pre-treatment process for coating, which notably improves both the surface roughness of a coating layer of a cemented carbide cutting tool and the bonding force of the coating layer to the substrate.

It is another object of the present invention to provide an improved coating method, which forms a coating layer on a pre-treated cemented carbide cutting tool.

It is yet another object of the present invention to provide a cemented carbide cutting tool, which has an excellent surface roughness of a coating layer as well as a high bonding force between the coating layer and the substrate.

In order to achieve the above objects and other objects, the pre-treating method of the present invention properly removes a sintered surface layer of 0.5~5 μm from the surface of the substrate, which corresponds to a tungsten carbide particle size of the substrate of the cemented carbide cutting tool. The porous sintered surface layer with a non-uniform structure is thereby removed. Consequently, a substrate surface having a higher composition density and evenness results than that which is provided by the blasting. In such a case, the surface ratio of open pores around the tungsten carbide particles, which come out after the porous sintered surface is removed, should be equal to or more than 5% of the surface in order to ensure a sufficient bonding force between the coating layer and the substrate.

Brush-lapping treatments may be used to remove the surface layer.

The pre-treated substrate surface may be coated by using conventional coating methods such as CVD, PVD, etc. Post-treatment process, such as blasting and brushing, may additionally be applied after the coating process to further enhance the surface roughness of the coating layer.

When coating is applied to the substrate that is pre-treated by removing the prescribed thickness of a sintered surface layer, the cores of the coating material, which act as the starting point of the formation of the coating layer, are uniformly formed on the substrate surface. As a result, an excellent coating layer having a surface roughness of Ra 0.05~0.2 μm (PVD coated) is obtained. Thus, when post-treatment such as blasting or brushing is applied to the coating surface, the surface roughness will reach Ra 0.05~0.15 μm within a short period of time due to the excellent surface roughness of the coated cemented carbide cutting tools, which are pre-treated before coating.

Further, the surface ratio of the open pores of equal to or more than 7% on the substrate surface provides an anchor effect, which prevents the coating layer (PVD coating layer in particular) from sliding away from the substrate. Thus, the bonding strength between the coating layer and the substrate is remarkably enhanced.

The coated cemented carbide cutting tool, to which the pre-treatment process of the present invention is applied before coating, has an improved tool life of more than approximately 25% compared to the coated cemented carbide, which is pre-treated by conventional blasting before coating.

DETAILED DESCRIPTION

A coated cemented carbide cutting tool of the present invention will now be described with reference to the accompanying drawings.

Figure 1:
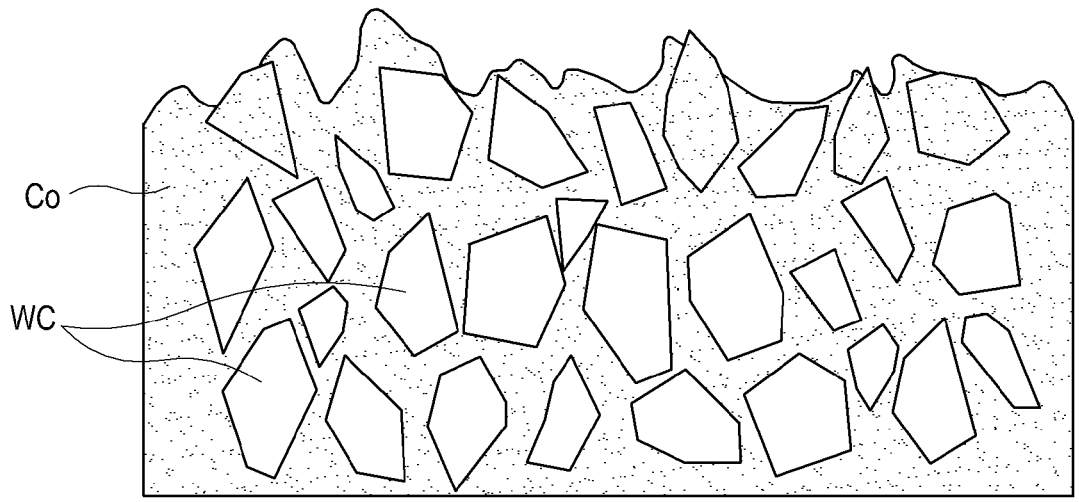
FIG. 1 is a diagram showing a cross-sectional view of a substrate of a cemented carbide cutting insert that is pre-treated by blasting.
Figure 2:
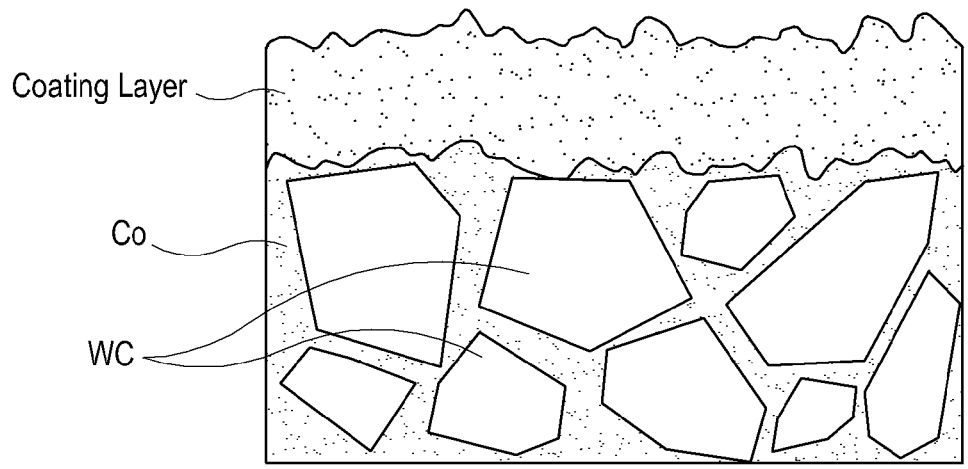
FIG. 2 is a diagram showing a cross-sectional view of the cemented carbide cutting insert of FIG. 1 having a coating layer formed on the substrate.

FIG. 1 is a diagram showing a cross-sectional view of a substrate of a cemented carbide cutting insert, which is pre-treated by blasting. From FIG. 1, it can be seen that a sintered surface is not uniformly and satisfactorily polished even after the blasting is performed and its severe unevenness is remained. When a coating layer is formed on the surface of the substrate of FIG. 1, the surface roughness becomes high due to an inconstant thickness of the coating layer and the severe unevenness of the surface as shown in FIG. 2.

Figure 3:
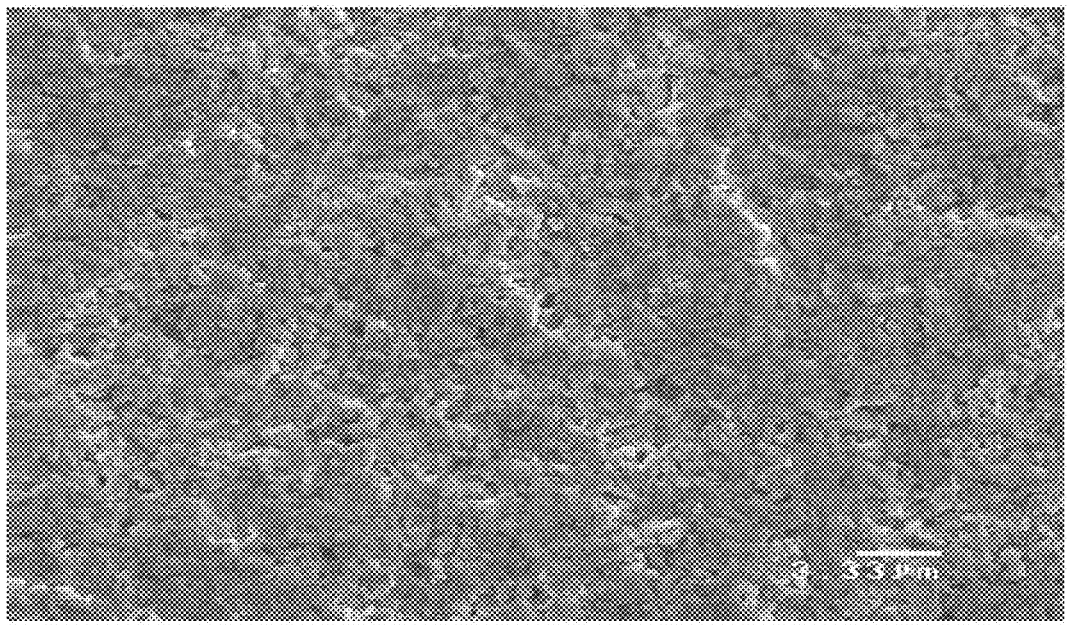
FIG. 3 is an electron microscopic photograph showing the substrate surface of a cemented carbide cutting insert that is pre-treated by blasting.

FIG. 3 is a photograph of the substrate surface of a cemented carbide cutting insert that is pre-treated by blasting, which is taken by an electron microscope at a magnification of 3000. The substrate of said cemented carbide cutting insert had a composition of (WC-8% Co) and was pre-treated by blasting under a pressure of 1.5 bar. As shown in FIG. 3, the substrate surface has a non-uniform structure.

Figure 4:
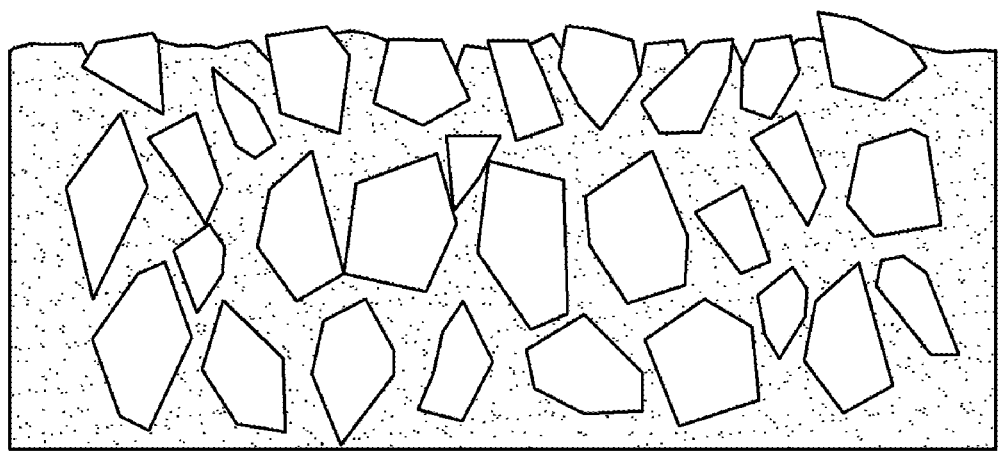
FIG. 4 is a diagram showing a cross-sectional view of a substrate of a cemented carbide cutting insert that is pre-treated according to the present invention.
Figure 5:
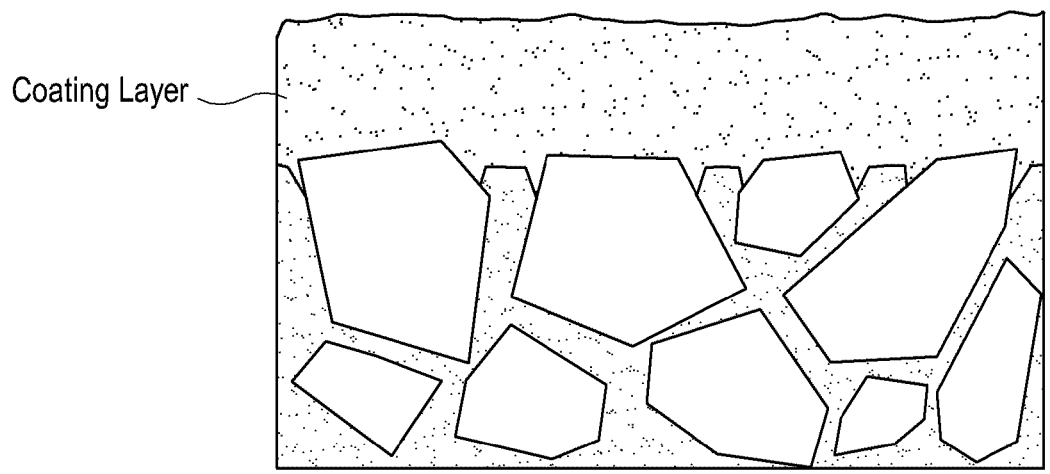
FIG. 5 is a diagram showing a cross-sectional view of the cemented carbide cutting insert of FIG. 4 having a coating layer formed on the substrate.

FIG. 4 is a diagram showing a cross-sectional view of a substrate of a cemented carbide cutting insert, which is pre-treated according to the present invention. A part having a thickness corresponding to the tungsten carbide particle size is removed from the surface of the cemented carbide substrate. Thus, a compact and uniform internal structure appears on the surface. Accordingly, as shown in FIG. 5, the surface roughness of the coating layer formed on the surface is remarkably improved.

Figure 6:
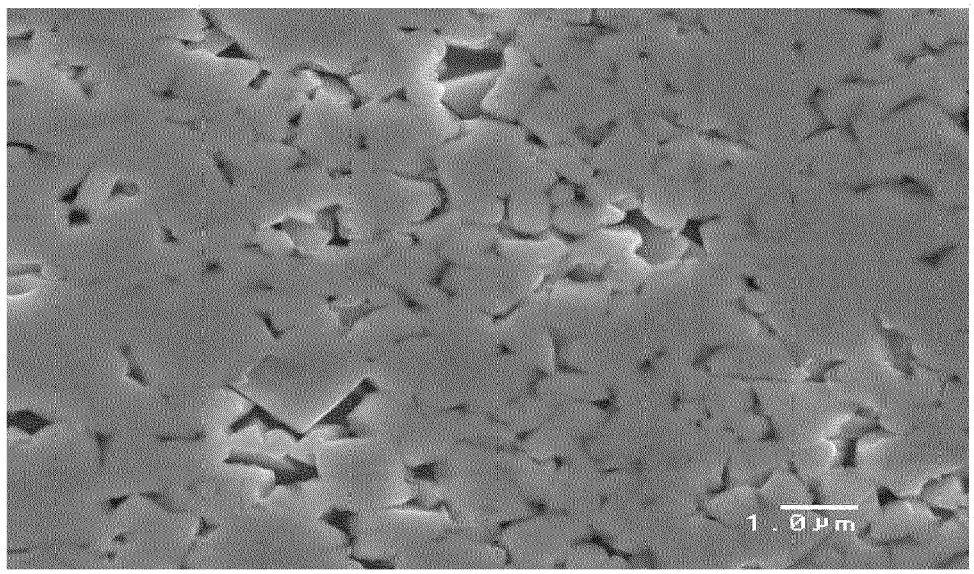
FIG. 6 is an electron microscopic photograph showing the substrate surface of a cemented carbide cutting insert that is pre-treated according to one embodiment of the present invention.

Further, FIG. 6 is a photograph of a substrate surface of a cemented carbide cutting insert that is pre-treated according to the present invention, which is taken by an electron microscope at a magnification of 10000. The substrate of said cemented carbide cutting insert had a composition of (WC-8% Co) and was pre-treated for 50 seconds by means of a rotary brush. Black portions shown in FIG. 6 are open pores on the substrate surface. If a surface ratio of the open pores, which come out on the substrate surface of the cemented carbide cutting insert pre-treated according to the present invention, is equal to or more than 5%, then the anchor effect of preventing sliding between the substrate and the coating layer is notably enhanced. The surface ratio of the open pores can be measured by taking photographs of the surface structure of the substrate with an optical microscope and then calculating shadow ratio of the surface structure by an image scanning program known in the art.

Figure 7:
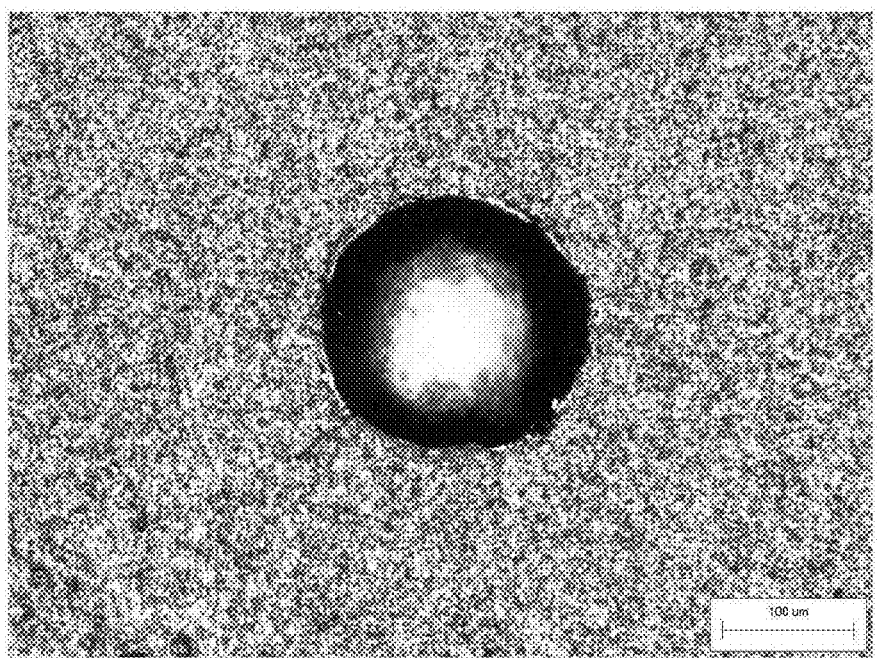
FIG. 7 is an optical microscopic photograph showing the cutting insert after conducting an indentation test to show the adhesive strength of the coating layer with respect to the substrate of a cemented carbide cutting insert that is pre-treated by blasting.
Figure 8:
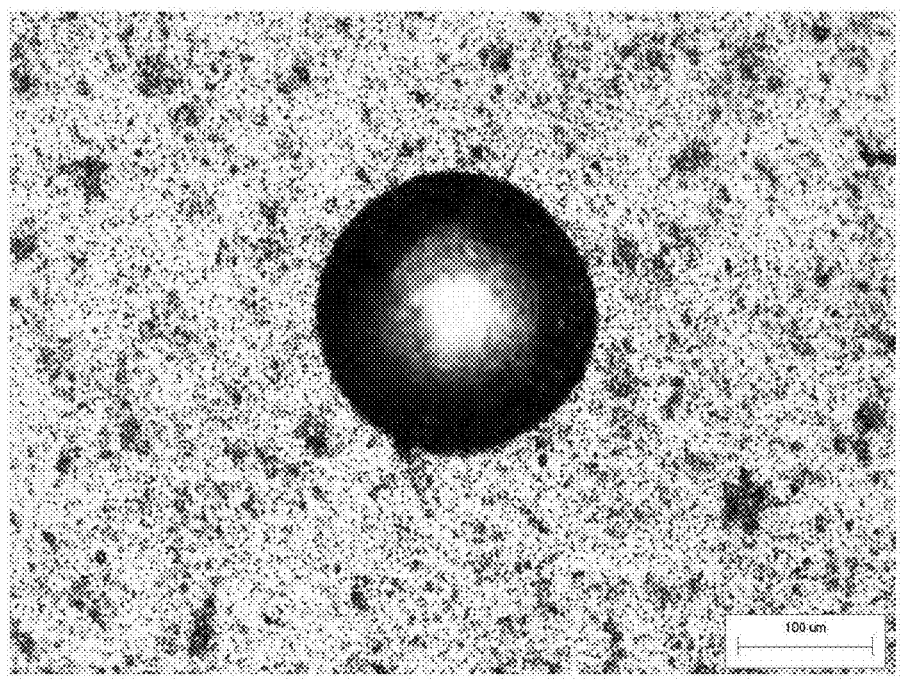
FIG. 8 is an optical microscopic photograph showing the cutting insert after conducting an indentation test to show the adhesive strength of the coating layer with respect to the substrate of the cemented carbide cutting insert that is pre-treated according to the present invention.

FIGS. 7 and 8 are photographs taken by an electron microscope at a magnification of 100 after conducting indentation tests to compare the adhesion strengths of the coating layer to the substrate of the cemented carbide cutting insert. FIG. 7 shows that the substrate of the cemented carbide cutting insert is pre-treated by blasting and is then PVD coated with AlTiN coating layer having a thickness of about 4 μm. FIG. 8 shows a substrate of the cemented carbide cutting insert, which is pre-treated according to the present invention and then coated with a coating layer having the same composition and thickness as those of the coating layer of FIG. 7. In the indentation test, a Rockwell hardness tester HRa was used and an indenter with a generally ball-shaped tip was indented under the load of 60 kg.

When comparing FIGS. 7 and 8, the coating layer of the cutting insert shown in FIG. 7 shows some cracks around the indentation formed by the pressing of the indenter thereto, whereas the coating layer of the cutting insert of FIG. 8 shows a clear ball-shaped indentation similar to the shape of the indenter without any cracks. The cracks of FIG. 7 are due to the low bonding strength between the coating layer and the substrate.

The test examples of the coated cemented carbide cutting insert, which is fabricated by pre-treating in accordance with the present invention, will be described below.

[Test 1]

A cutting performance test of the coated cutting tool fabricated in accordance with the present invention was conducted by the present inventors as described below.

The tool life of each cutting insert was measured, wherein the tool life is the time spent for a wear amount of a flank face of the cutting tool to reach 0.25 mm. In case breakage, chipping or peeling off of a cutting edge or separation of a coating layer occurred during the cutting, the time spent before such breakage, chipping or peeling off was evaluated as the tool life of the cutting tool.

In the cutting performance test, a stainless steel workpiece (SUS304) was cut with a cemented carbide turning insert A, on which a TiN/MTCN/a-$Al_2O_3$/TiN coating layer (arrangement of this coating layer is in order away from a substrate) is CVD coated after pre-treating, the turning insert A being CNMG432 according to the ISO standards. Further, an inconel workpiece (Inconel 718) was cut with a cemented carbide turning insert B, on which a AlTiN coating layer is PVD coated after pre-treating, the turning insert B having the same standard as the turning insert A. The present inventors tested for each cutting inserts A and B, one test where the pre-treating method according to the present invention is applied and the other test where the conventional pre-treating method according to the blasting method is applied.

The cutting conditions of the insert A were: cutting speed (v)=200 rpm; feed rate (f)=0.30 mm/rev; depth of cut (d)=2.0 mm; and wet cutting. Further, the cutting conditions of the insert B were: cutting speed (v)=60 rpm; feed rate (f)=0.16 mm/rev; depth of cut (d)=1.0 mm and; wet cutting. Test results are shown in [Table 1] below.

TABLE 1

| Insert | Arrangement of Coating layer (Coating method) | Workpiece | Pre-treating Method | Cutting tool life | Remarks |
|---|---|---|---|---|---|
| A | TiN/MTCN/α-Al2O3/TiN (CVD) | SUS304 | Conventional Blasting | 6 mins 18 secs | — |
|   |   |   | Present Invention | 8 mins 7 secs | — |
| B | AlTiN (PVD) | Inconel718 | Conventional Blasting | 10 mins 34 secs | Coating layer separation |
|   |   |   | Present Invention | 13 mins 21 secs | — |

As shown in Table 1, the cutting inserts that are coated after being pre-treated in accordance with the present invention have longer tool lives than those of the cutting inserts, which are coated after being pre-treated by the conventional blasting method. As for the cutting insert A, the one with pre-treatment in accordance with the present invention showed a tool life that is longer by about 28% over the one with pre-treatment using the conventional blasting method. As for the cutting insert B, the one with pre-treatment in accordance with the present invention showed a tool life that is longer by about 26% over the one which was pre-treated by the conventional blasting method.

This is because the surface of the coating layer of the cemented carbide cutting tool fabricated in accordance with the present invention is fine and even. Thus, it has low cutting resistance and does not adhere to the workpiece. Further, these are the result of a significantly improved bonding force between the substrate and the coating layer.

While the present invention has been particularly shown and described with reference to exemplary embodiments thereof, it will be understood by those of ordinary skill in the art that various alternations or modifications can be made without departing from the scope of the present invention.

The invention claimed is:

1. A method of manufacturing a coated cemented carbide cutting tool, comprising:
   a step of uniformly removing, by brushing and not blasting, a substrate surface of a cemented carbide cutting tool within a range of 0.5-5 μm such that the removed surface is flat and a surface ratio of open pores around tungsten carbide particles is equal to or more than 5%; and
   a step of applying coating on the removed surface, such that the coating layer is formed to have a surface roughness of Ra 0.05-0.2 μm without any post-treatment of said coating layer.

2. The method of claim 1, further comprising a step of post-treating the coating layer to enhance a surface roughness of the coating layer after the coating is applied.

3. A coated cemented carbide cutting tool comprising a cemented carbide substrate and a coating layer thereon, the cutting tool having a surface roughness of Ra 0.05-0.2 μm without post-treatment of the coating layer, wherein the surface of the cemented carbide substrate is uniformly removed, by brushing and not blasting, within a range of 0.5-5 μm before coating so that a surface ratio of open pores existing around tungsten carbide particles on the substrate surface before coating is equal to or more than 5%.

4. A method of manufacturing a coated cemented carbide cutting insert, comprising:
   providing a cemented carbide cutting insert substrate comprising tungsten carbide particles and having a substrate surface;
   removing 0.5-5.0 μm of the substrate surface, by brushing and not blasting, to thereby form a treated substrate surface in which at least some tungsten carbide particles and open pores around the tungsten carbide particles are initially exposed, the open pores constituting at least 5% of the surface area of the treated substrate surface; and
   applying a coating over the treated substrate surface, such that the coating layer is formed to have a surface roughness of Ra 0.05- 0.2 μm without post-treatment of said coating layer.

5. The method according to claim 4, further comprising post-treating the coating layer to enhance a surface roughness of the coating layer, after the coating has been applied.

6. The method according to claim 4, wherein applying said coating causes coating material to cover the initially exposed tungsten carbide particles and the initially exposed open pores to thereby promote bonding of the coating material to the treated substrate surface.

7. A coated cemented carbide cutting insert comprising:
   a cemented carbide cutting insert substrate comprising a treated substrate surface in which at least some tungsten carbide particles and open pores around the tungsten carbide particles are initially exposed by removing 0.5-5.0 μm of the substrate by brushing and not blasting, the open pores constituting at least 5% of the surface area of the treated substrate surface; and
   a coating layer bonded to the treated substrate surface, the coating layer comprising coating material covering the initially exposed tungsten carbide particles and the initially exposed open pores, wherein the coating layer has surface roughness of Ra 0.05 - 0.2 μm without post-treatment of said coating layer.

* * * * *